United States Patent
Cai et al.

(10) Patent No.: US 11,531,383 B1
(45) Date of Patent: Dec. 20, 2022

(54) MIST COOLING FOR COMPUTER SYSTEMS

(71) Applicant: Amazon Technologies, Inc., Seattle, WA (US)

(72) Inventors: Steve Qingjun Cai, Seatac, WA (US); Ismael Medrano, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 51 days.

(21) Appl. No.: 17/039,950

(22) Filed: Sep. 30, 2020

(51) Int. Cl.
*G06F 1/20* (2006.01)
*H05K 7/20* (2006.01)

(52) U.S. Cl.
CPC ............. *G06F 1/20* (2013.01); *H05K 7/2029* (2013.01); *H05K 7/20345* (2013.01); *H05K 7/20809* (2013.01)

(58) Field of Classification Search
CPC .... G06F 1/20; H05K 7/20345; H05K 7/2029; H05K 7/20709; H05K 7/20663; H05K 7/208; H05K 7/20809
See application file for complete search history.

(56) References Cited

U.S. PATENT DOCUMENTS

| | | |
|---|---|---|
| 3,602,774 A | 8/1971 | Grant et al. |
| 3,660,784 A * | 5/1972 | Scharfman ............ H01P 1/262 165/47 |
| 5,150,277 A | 9/1992 | Bainbridge et al. |
| 5,234,591 A | 8/1993 | Darnell et al. |
| 5,361,188 A | 11/1994 | Kondou et al. |
| 5,491,363 A * | 2/1996 | Yoshikawa ......... H01L 23/4332 257/715 |
| 5,506,750 A | 4/1996 | Carteau et al. |
| 5,796,580 A | 8/1998 | Komatsu et al. |
| 5,907,473 A * | 5/1999 | Przilas ............... H05K 7/20345 174/15.1 |
| 6,170,561 B1 | 1/2001 | O'Grady |
| 6,234,591 B1 | 5/2001 | Driscoll et al. |
| 6,459,571 B1 | 10/2002 | Carteau |
| 6,506,111 B2 | 1/2003 | Sharp et al. |

(Continued)

FOREIGN PATENT DOCUMENTS

| | | | |
|---|---|---|---|
| CN | 108919926 A | * 11/2018 | |
| KR | 20160043943 A | * 4/2016 | |
| WO | WO-2014142098 A1 | * 9/2014 | ............ F25B 19/02 |

OTHER PUBLICATIONS

Lee Dong Ju, "Apparatus for cooling server room and air conditioning system for data center therewith", Apr. 22, 2016, Naver Business Platform Corp, Entire Document (Translation of KR 20160043943). (Year: 2016).*

(Continued)

*Primary Examiner* — Stephen S Sul
(74) *Attorney, Agent, or Firm* — Alexander A. Knapp; Kowert, Hood, Munyon, Rankin & Goetzel, P.C.

(57) ABSTRACT

A computer system includes a mist cooling system. The mist cooling system suspended droplets of dielectric fluid in air to form a mist and conveys the mist to heat producing components of the computer system. The liquid droplets of the mist wet the heat producing components and remove waste heat as part of a phase change from a liquid phase to a vapor phase. Vaporized dielectric fluid is condensed via a heat exchanger in a chassis of the computer system and is returned to a reservoir for use in generating mist.

20 Claims, 15 Drawing Sheets

(56) References Cited

U.S. PATENT DOCUMENTS

| | | |
|---|---|---|
| 6,765,796 B2 | 7/2004 | Hoffman et al. |
| 6,775,137 B2 | 8/2004 | Chu et al. |
| 6,801,428 B2 | 10/2004 | Smith et al. |
| 6,955,062 B2 | 10/2005 | Tilton et al. |
| 6,955,063 B2 | 10/2005 | Adiga et al. |
| 7,085,133 B2 | 8/2006 | Hall |
| 7,200,008 B1 | 4/2007 | Bhugra |
| 7,359,186 B2 | 4/2008 | Honda et al. |
| 7,489,509 B2 | 2/2009 | Keenan et al. |
| 7,505,269 B1 | 3/2009 | Cosley et al. |
| 7,508,663 B2 | 3/2009 | Coglitore |
| 7,760,502 B2 | 7/2010 | Meyer, III et al. |
| 7,869,210 B2 | 1/2011 | Moss |
| 8,028,796 B2 | 10/2011 | Ishihara |
| 8,053,748 B2 | 11/2011 | Shah et al. |
| 8,154,870 B1 | 4/2012 | Czamara et al. |
| 8,191,841 B2 | 6/2012 | Jeffery et al. |
| 8,331,095 B2 | 12/2012 | Hu et al. |
| 8,472,181 B2 | 6/2013 | Doll |
| 8,760,855 B2 | 6/2014 | Howes et al. |
| 8,867,204 B1 | 10/2014 | Gardner |
| 8,879,247 B2 | 11/2014 | Archibald et al. |
| 9,681,589 B1 | 6/2017 | Ross et al. |
| 10,798,851 B1* | 10/2020 | Weber .................... F28D 15/06 |
| 11,071,238 B2* | 7/2021 | Edmunds ........... H05K 7/20772 |
| 2004/0057203 A1 | 3/2004 | Rabinovitz |
| 2004/0218355 A1 | 11/2004 | Bash et al. |
| 2004/0250562 A1* | 12/2004 | Adiga ................ H05K 7/20345 62/304 |
| 2005/0057898 A1 | 3/2005 | El-Batal et al. |
| 2005/0174733 A1 | 8/2005 | Novotny |
| 2005/0237716 A1 | 10/2005 | Chu et al. |
| 2006/0187634 A1 | 8/2006 | Tanaka et al. |
| 2007/0053169 A1 | 3/2007 | Carlson et al. |
| 2007/0091559 A1 | 4/2007 | Malone |
| 2007/0133173 A1* | 6/2007 | Hsiung ............... H01L 23/4735 361/699 |
| 2007/0233781 A1 | 10/2007 | Starr et al. |
| 2008/0084666 A1 | 4/2008 | Kehl et al. |
| 2008/0123297 A1* | 5/2008 | Tilton ................ H05K 7/20345 361/700 |
| 2009/0086434 A1 | 4/2009 | Hodes et al. |
| 2009/0144568 A1 | 6/2009 | Fung |
| 2010/0039773 A1* | 2/2010 | Tilton ................ H01L 23/4735 361/699 |
| 2010/0091447 A1 | 4/2010 | Jaggers et al. |
| 2010/0134972 A1 | 6/2010 | Moss |
| 2010/0154448 A1 | 6/2010 | Hay |
| 2011/0083827 A1 | 4/2011 | Salyer |
| 2011/0255237 A1 | 10/2011 | Doll |
| 2012/0243170 A1 | 9/2012 | Frink et al. |
| 2013/0125486 A1 | 5/2013 | Curtin et al. |
| 2014/0078668 A1 | 3/2014 | Goulden et al. |
| 2018/0098458 A1* | 4/2018 | Chainer ................ H01L 23/367 |
| 2018/0368289 A1* | 12/2018 | Wang ...................... H05K 7/20 |
| 2020/0305307 A1* | 9/2020 | Amos ................ H01L 23/4735 |
| 2021/0164704 A1* | 6/2021 | Puago Martinez ..... H01T 19/00 |
| 2021/0307210 A1* | 9/2021 | Wong .................... H05K 7/202 |
| 2021/0385974 A1* | 12/2021 | Ong Kong Chye ........................ H05K 7/20345 |

OTHER PUBLICATIONS

Xu Mengting, "Sprinkling type cooling system and device used for high-density server", Nov. 30, 2018, Nanjing Canatal Data CT ENV. Tech. Co. LTD, Entire Document (Translation of CN 108919926). (Year: 2018).*

Hashiba, Tomohiko, "Electroic Machinery Cooling Systme", Wingturf Co., Ltd., Sep. 18, 2014, Entire Document (Translation of WO 2014142098). (Year: 2014).*

* cited by examiner

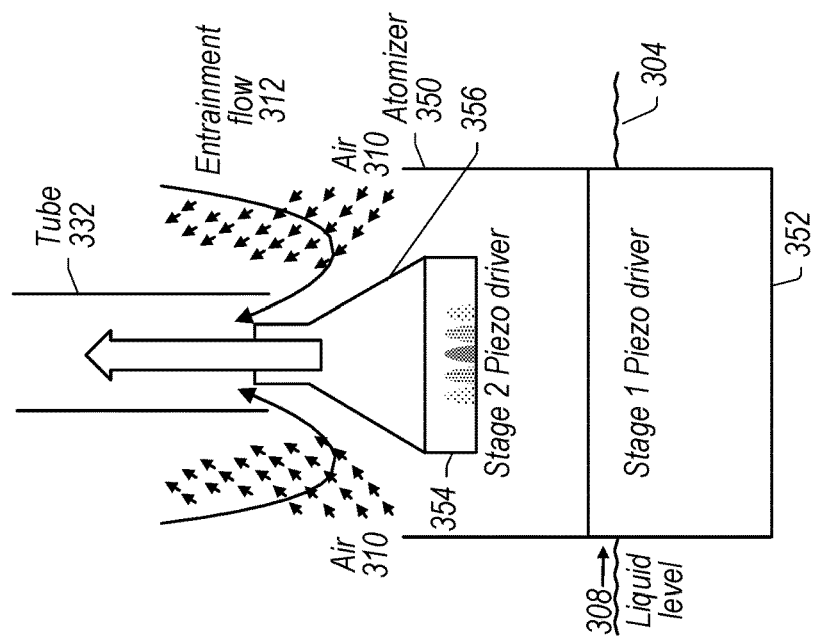
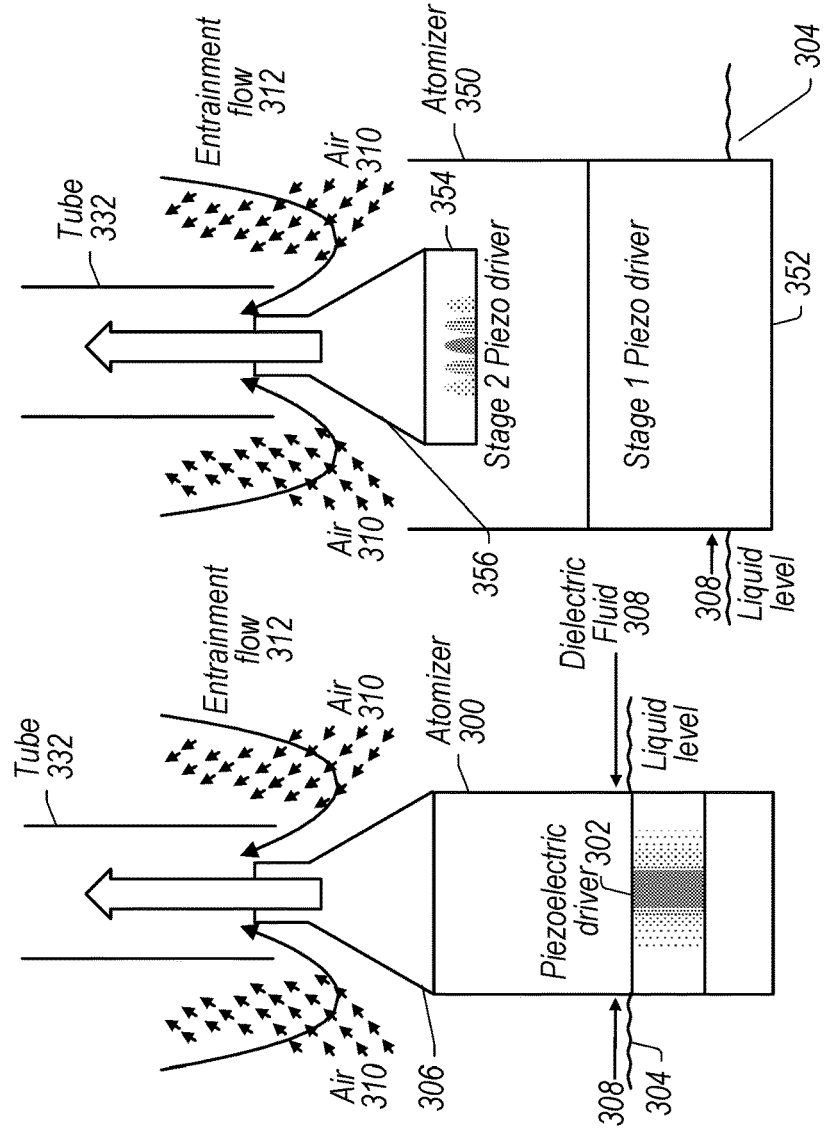
FIG. 3A  FIG. 3B  FIG. 3C

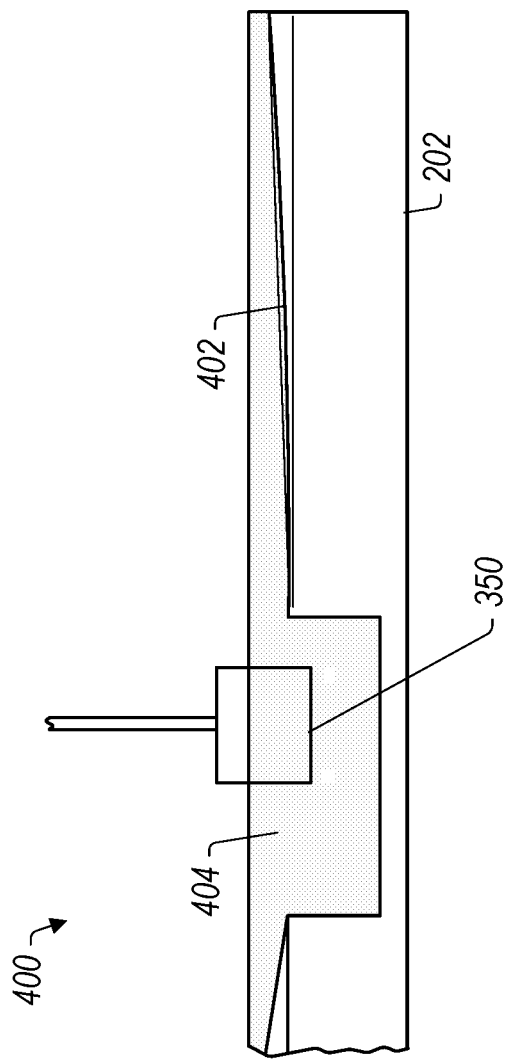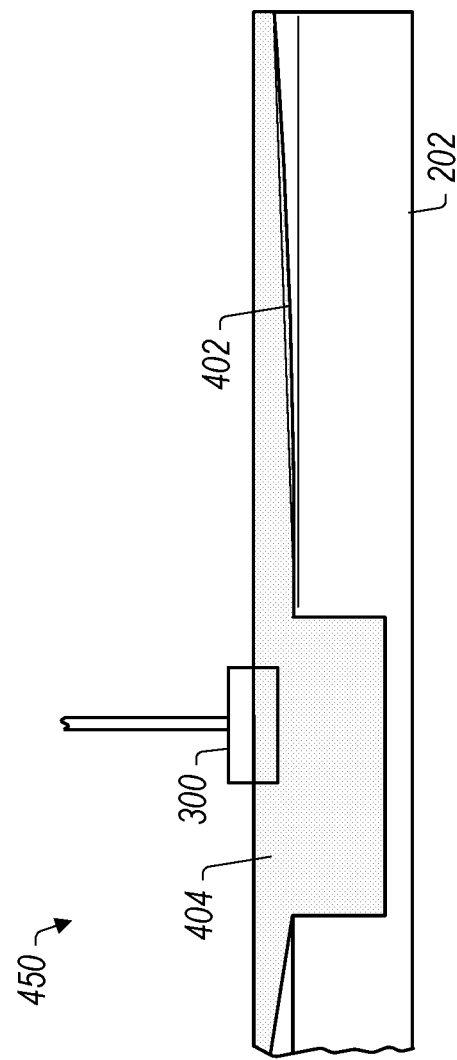

*Design Table* 970

| Oscillation Frequency (Hz) | Mass Flow (gm/sec) |
|---|---|
| $f_1$ | Mass Flow$_A$ |
| $f_2$ | Mass Flow$_B$ |
| $f_3$ | Mass Flow$_C$ |
| $f_4$ | Mass Flow$_D$ |
| $f_5$ | Mass Flow$_E$ |
| $f_6$ | Mass Flow$_F$ |

*FIG. 9C*

Control Table

| Control Output (%) | Heat Removal (watts) |
|---|---|
| 0-20 | $0 - H_1$ |
| 21-40 | $H_2 - H_3$ |
| 41-60 | $H_4 - H_5$ |
| 61-80 | $H_6 - H_7$ |
| 81-100 | $H_8 - H_9$ |

MIST COOLING FOR COMPUTER SYSTEMS

BACKGROUND

Some computer systems include a number of components that generate waste heat. Such components include printed circuit boards, mass storage devices, power supplies, and processors. For example, some computers with multiple processors may generate 400 watts of waste heat. Some known computer systems include a plurality of such larger, multiple-processor computers that are configured into rack-mounted components, and then are subsequently positioned within a rack system. Some known rack systems include 40 such rack-mounted components and such rack systems will therefore generate as much as 30 kilowatts of waste heat. Moreover, some known data centers include a plurality of such rack systems.

Some computer systems, which may function as servers, include a number of components that are mounted in an interior of the computer systems. The components, which can include printed circuit boards (for example, a motherboard) and mass storage devices, can support one or more components that generate waste heat, referred to herein as "heat-producing components." For example, a motherboard can support a central processing unit, and mass storage devices can include hard disk drives which include motors and electronic components that generate heat. Mass storage devices can also include solid state drives that generate heat. Some or all of this heat must be removed from the components to maintain continuous operation of a computer system.

BRIEF DESCRIPTION OF THE DRAWINGS

FIG. 3A is a block-diagram illustrating operation of a single-stage mist generator, according to some embodiments.

FIGS. 3B and 3C are block-diagrams illustrating operation of a two-stage mist generator with different reservoir levels, according to some embodiments.

FIGS. 4A and 4B illustrate side views of a reservoir, wherein different types of mist generators are either positioned in the dielectric fluid of the reservoir or positioned at a surface of the dielectric fluid of the reservoir, according to some embodiments.

FIGS. 9A, 9B, and 9C illustrate simplified versions of example design tables for a mist cooling system, according to some embodiments.

FIG. 10 illustrates a simplified version of a control table for a mist cooling system, according to some embodiments.

Figure 1:
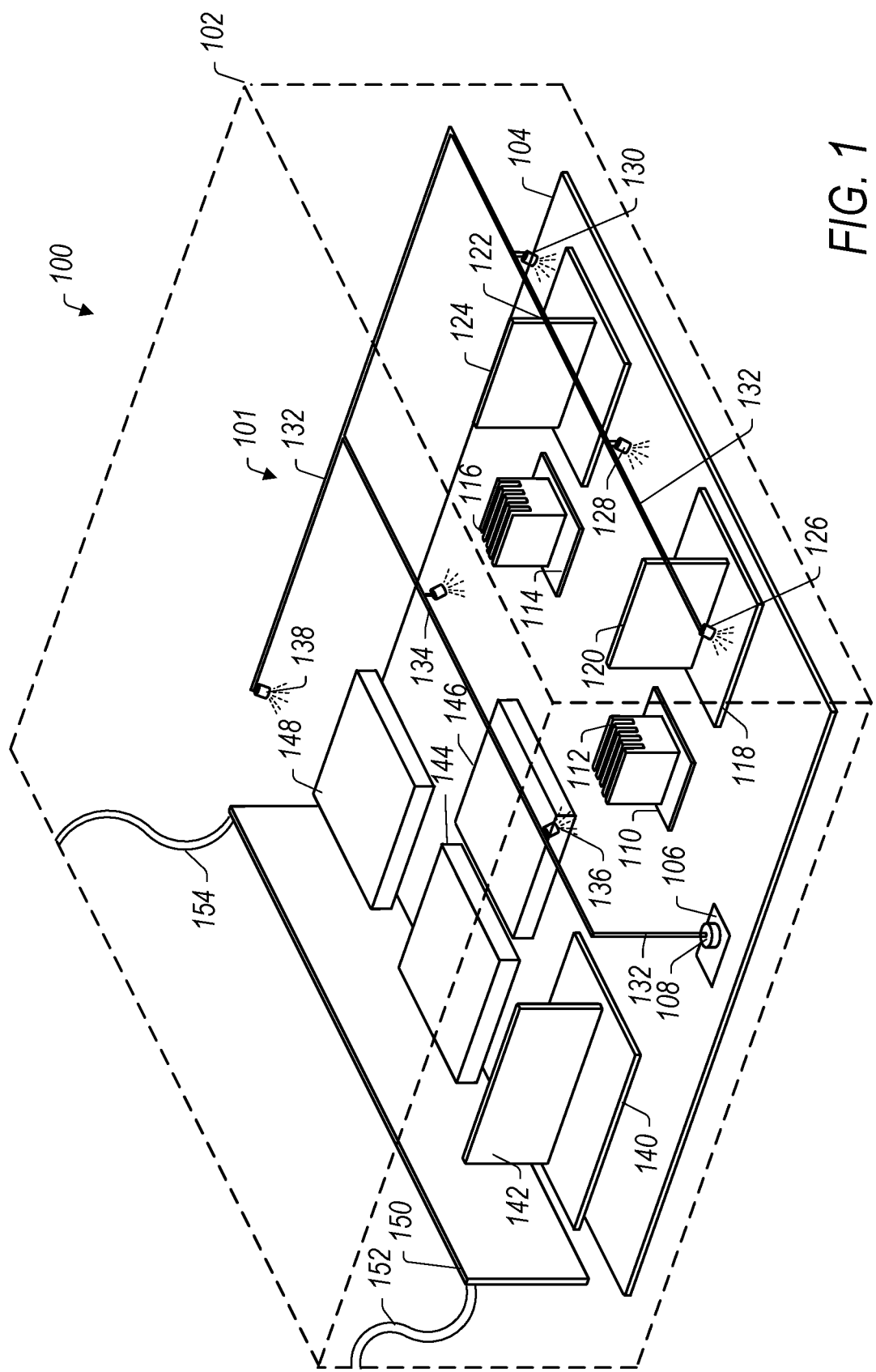
FIG. 1 is a perspective view of a computer system that includes a mist cooling system, according to some embodiments.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of computer systems, and systems and methods for performing computing operations and removing waste heat from various heat-producing components in computer systems, are disclosed.

According to one embodiment, a computer system includes a chassis, heat producing components mounted in the chassis and a mist cooling system located within the chassis. The mist cooling system is configured to remove waste heat from the heat producing components of the computer system that are mounted in the chassis by distributing a mist comprising droplets of dielectric fluid suspended in air. The liquid droplets of dielectric fluid change phase when in contact with the heat producing components of the computer system. This phase change results in thermal energy being removed from the heat producing components and being absorbed into the dielectric fluid via the process of changing the dielectric fluid from a liquid phase to a vapor phase. Also, the vaporized dielectric fluid may later be condensed back into a liquid phase and be recycled such that it is once again used to generate a mist to cool the heat producing components of the computer system.

The mist cooling system included in the computer system chassis includes a reservoir positioned in a bottom portion of the chassis, a mist generator, one or more tubes, and a heat exchanger. The mist generator is configured to draw dielectric fluid from the reservoir and combine the dielectric fluid with air to generate a mist comprising liquid droplets of the dielectric fluid suspended in the air. The mist is distributed within the chassis of the computer system via the one or more tubes, which are coupled with the mist generator and which are configured to direct the mist to one or more of the heat producing components of the computer system. In some embodiments, the one or more tubes may include a microstructure on an inner wall of the tubes and/or a coating on the inner wall of the tubes that prevents or reduces an amount of liquid droplets of the mist that coalesce in the tubes. The heat exchanger is also mounted in the chassis of the computer system and is configured to condense a portion of the dielectric fluid that has changed phase from a liquid phase to a vapor phase, wherein the portion of the dielectric fluid in the vapor phase has undergone a phase change as part of removing the waste heat from the heat producing components of the computer system.

In some embodiments the heat exchanger may be liquid cooled, such that waste heat is removed from the heat producing components via the droplets of the mist and the waste heat transferred into the vaporized mist droplets is then transferred to a cooling liquid flowing through the heat exchanger such that the dielectric fluid is condensed and available to be re-used to generate more mist.

According to one embodiment, a mist cooling system includes a reservoir configured to be positioned in a bottom portion of a chassis of a computer system. The mist cooling system also includes a mist generator configured to draw dielectric fluid from the reservoir and combine the dielectric fluid with air to generate a mist comprising liquid droplets of the dielectric fluid suspended in the air. Additionally, the mist cooling system includes one or more tubes coupled with the mist generator, wherein the one or more tubes are configured to direct the mist to one or more heat producing components of the computer system.

According to one embodiment, a method includes generating a mist comprising droplets of dielectric fluid suspended in air, conveying the mist, via one or more tubes mounted in a chassis of a computer system, to heat producing components of the computer system, and removing waste heat from the heat producing components wherein liquid droplets of the mist remove waste heat from the heat producing components as part of a phase change from a liquid phase to a vapor phase.

As used herein, "backplane" means a plate or board to which other electronic components, such as mass storage devices, circuit boards, can be mounted. In some embodiments, mass storage devices, which can include one or more hard disk drives or solid state drives, are plugged into a backplane in a generally horizontal orientation relative to the face of the backplane. In some embodiments, a backplane includes and one or more power buses that can transmit power to components on the backplane, and one or more data buses that can transmit data to and from components installed on the backplane. In some embodiments, processors, such as central processing units (CPUs), graphics processing units (GPUs), application specific integrated circuits (ASICs), field programmable gate arrays (FPGAs), etc. may be coupled to a backplane.

As used herein, "chassis" means a structure or element that supports another element or to which other elements can be mounted. A chassis may have any shape or construction, including a frame, a sheet, a plate, a box, a channel, or a combination thereof. In one embodiment, a chassis is made from one or more sheet metal parts. A chassis for a computer system may support circuit board assemblies, power supply units, data storage devices, a mist cooling system, a heat exchanger, cables, and other components of the computer system.

As used herein, "computing" includes any operations that can be performed by a computer, such as computation, data storage, data retrieval, or communications.

As used herein, "computer system" includes any of various computer systems, computing devices, or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control. Computer systems as described herein may be mounted in racks included in a data center in some embodiments.

As used herein, to "direct" a mist includes directing or channeling the mist, such as to a region or point in space. In various embodiments, mist movement for directing mist may be induced by creating a high pressure region, a low pressure region, or a combination of both. For example, a mist may be directed through a tube due to a pressure differential between an inlet of the tube and an exit of the tube. Also pressure zones within a chassis may cause a mist to be directed within a chassis of a computer system.

In contrast to liquid submersion cooling systems, a computer system cooled by a mist cooling system may not be completely or substantially filled with a liquid cooling fluid. Instead a liquid cooling fluid may be collected in a reservoir in a bottom portion of a chassis of a computer system while a vast majority of the interior of the chassis is not filled with liquid. In such embodiments, a cloud of mist may be maintained within the interior of the chassis, wherein the cloud of mist comprises liquid droplets of dielectric fluid suspended in air. As compared to liquid submersion cooling systems, a mist cooling system may be substantially lighter because the mist/air in the chassis interior is lighter than a liquid cooling fluid used in liquid submersion cooling systems. Also, a mist cooling system may not require substantial draining and/or safety issues that arise in liquid submersion cooling systems when access is needed to internal components that would be submersed in a cooling fluid in a liquid submersion cooling system. For example a computer system cooled by a mist cooling system may be accessible simply by turning off the mist generator wherein liquid droplets suspended in the mist coalesce and fall to the bottom of the chassis of the computer system and/or those that remain in suspension do not cause a safety or leak issue when opening the chassis.

In some embodiments, a mist generator may include an atomizer that generates the mist and the atomizer may include an ultrasound Piezo atomizer or pressure nozzle. In some embodiments, an ultrasound Piezo atomizer may have a limited number of moving components, such as a single ceramic disk that oscillates to create the mist. The limited number of moving components may provide high reliability for such systems. Also the ultrasound Piezo atomizer may include a design that entrains air in the mist leaving the ultrasound Piezo atomizer which further creates a transport mechanism to convey the mist trough tubes attached to the mist generator.

Additionally, tubes distribute the mist from the mist generator. Some tube exits of the tubes may be positioned to concentrate mist flow towards certain high-heat producing components of the computer system, while other tube exits may be positioned in such a way as to generally fill the interior of the chassis of the computer system with mist such that the mist fills the interior of the chassis and reaches both the high-heat producing components and other lesser-heat producing components. The tubes may include micro and nano structures on an inner tube wall along with a coating that enables mist droplets to maintain dynamic momentum and overcome coherent forces of the tube walls to stay in suspension when being conveyed via the tubes.

In some embodiments, a mist cooling system may be included in a standard 1U form factor chassis, wherein a 1U chassis is configured to mount in a 1U slot of an EIA standard 19" rack. In some embodiments, a mist cooling system may be included in larger or smaller chassis, such as a chassis that spans multiple 1U slots of an EIA standard 19" rack.

In some embodiments, the latent heat of vaporization which corresponds to the waste heat removed from heat producing components when the liquid droplets of the mist undergo a phase change may be multiple times greater than an amount of heat flux generated by convective heat transfer using air as a cooling medium. Also, the latent heat of vaporization may have a greater heat flux than liquid cooling systems that circulate a liquid cooling medium without going through a phase change. Also, in contrast to a liquid circulation system, a mist can reach all portions/corners of a chassis of a computing system, whereas heat transfer in a liquid circulation system is limited to a path of the tubes or heat exchangers that circulate the liquid.

In some embodiments, a mist cooling system may further include an active controller, such as a connection to a baseboard management controller (BMC) of the computer system. The active controller may adjust droplet diameter and or mist flowrate to control heat transfer from heat producing components of the computer system. For example, in some embodiments mist flow and/or droplet diameter may be increased to more rapidly remove heat. Also, droplet diameter may be reduced or adjusted to control an amount of time the droplets remain suspended in air within the chassis interior. For example, in order to substantially fill the chassis interior with mist and reach smaller heat producing components mounted in the chassis, droplet diameters may be reduced or mist flow may be increased such that an equilibrium is reached wherein the chassis interior is substantially filled with mist. For example, in some embodiments, dielectric fluid droplets with diameters on the order of 20-30 microns (e.g. micrometers) may stay suspended in air for a substantial amount of time, such as an hour or more. Also in some embodiments, a single mist generator may be adjusted to produce mist droplets having different diameters by adjusting a frequency of oscillation of a vibrating element of the mist generator. Also, mist flowrate may be adjusted by adjusting an amplitude of oscillation of the vibrating element of the mist generator.

In some embodiments, ultrasound vibrations may atomize liquids by causing droplets to separate from a surface of the liquid. In some embodiments, a ceramic disk or other vibrating element of the mist generator may oscillate at a high frequency to generate the ultrasound vibrations. A piezo electrical crystal may cause the disk to vibrate when a voltage is applied to the piezo electrical crystal with a supplied signal frequency. By adjusting the voltage or signal frequency being supplied to the piezo electrical crystal, the controller, such as a BMC, may adjust the amplitude and/or frequency of the oscillating vibrating element and therefore adjust the droplet size and/or mist generation rate.

In some embodiments, two or more mist generators may be included in a chassis of a computer system, wherein respective ones of the mist generators are adjusted to generate mists with droplets having different diameters. For example, a first mist generator may generate a mist with droplets having diameters in the range of 40 microns, wherein the mist is directed towards high-heat producing components such as a central processing unit (CPU) or a graphics processing unit (GPU). Additionally, a second mist generator may generate a mist with droplets having diameters in the range of 20-30 microns. The second mist may be directed towards larger volumes of the chassis that comprise less heat intense components, such as hard drives, memory devices, etc.

In some embodiments, in addition to or instead of an ultrasound atomizer, other types of mist generators may be used. For example, in some embodiments an atomizing nozzle may be used that shears a pressurized fluid into droplets. In such embodiments, a liquid pump or compressor may apply mechanical energy to the dielectric fluid to pressurize the dielectric fluid and the pressurized dielectric fluid may form a mist when exiting an atomizing nozzle.

In some embodiments, the use of a mist cooling system in a chassis of a computer system may replace the need for a fan cooling system or other additional cooling systems.

FIG. 1 is a perspective view of a computer system that includes a mist cooling system, according to some embodiments.

Computing system 100 includes mist cooling system 101 positioned inside of chassis 102. Computing system 100 also includes high-heat producing components and lower heat-producing components that are cooled by mist cooling system 101. For example, processors 110 and 114 may be central processing units (CPUs) or graphics processing units (GPUs) that generate greater amounts of waste heat that need to be removed. In some embodiments, heat sinks 112 and 116 may be in contact with processors 110 and 114 and may remove thermal energy from the processors. As another example, computing system 100 may include other heat producing components that may generate less waste heat than processors 110 and 114. For example, computing system 100 includes storage devices 144, 146, and 148, which may be hard disk drives and/or solid state memory devices. Also, computing system 100 includes other heat producing components such as circuits 118, 120 and 140 that include cards/risers 120, 124, and 142. Note that in various embodiments, computing system 100 may include various types of heat producing components, such as CPUs, GPUS, hard drives, solid-state memory devices, memory cards, field programmable gate arrays (FPGAs), application specific integrated circuits (ASICs), various other types of memory or storage devices, processors, control circuits, etc. All of which may generate waste heat in varying degrees and may require at least some cooling. In some embodiments, the heat producing components may be mounted on a circuit board, such as printed circuit board 104.

Figure 2A:
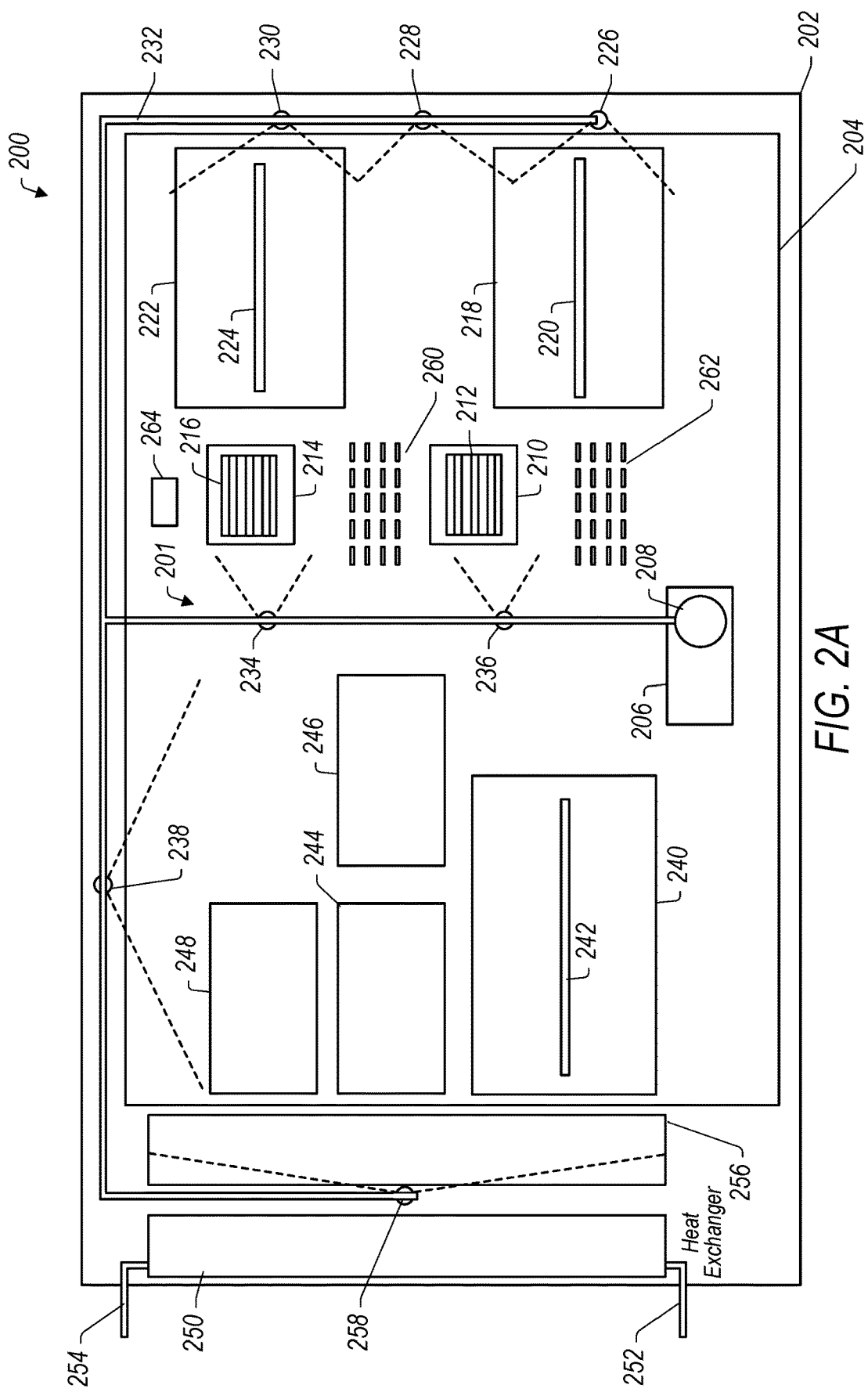
FIG. 2A is a top view of a computer system that includes a mist cooling system, according to some embodiments.

In some embodiments, a mist cooling system, such as mist cooling system 101, includes a reservoir of dielectric fluid and a mist generator, such as reservoir 106 and mist generator 108. As further illustrated in FIGS. 4A and 4B, a bottom portion of chassis 102 may be configured with a slope such that dielectric fluid drains back to reservoir 106. Also, in some embodiments, reservoir 106 may be formed via a spacer placed in a bottom portion of chassis 102, wherein the spacer is configured with a slope that drains dielectric fluid back towards reservoir 106. In some embodiments, printed circuit board 104 may include drain openings that allow dielectric fluid that has coalesced on printed circuit board 104 to drain toward a space under the printed circuit board 104 that slopes back towards reservoir 106. For example, as shown in FIG. 2A, printed circuit board 104 may include drain ports 260 and 262. Also, an area above reservoir 106 may be open such that dielectric fluid on top of printed circuit board 104 can drain back to the reservoir 106 through the open area above the reservoir.

In some embodiments, mist cooling system 101 further includes tubes 132 and tube exits 126, 128, 130, 134, 136, and 138. In some embodiments, tubes 132 may be configured with an inner wall microstructure and/or coating that prevents liquid droplets of the mist generated by mist generator 108 from coalescing in the tubes 132. Also, in some embodiments, the tube exits 126, 128, 130, 134, 136, and 138 may be open ends of the tubes 132 or open ends of tube fittings that direct mist from the tubes 132 to particular heat producing components of computer system 100. For example, exit 136 may direct mist towards processor 110 and the heat sink 112 associated with processor 110. Also exit 134 may direct mist towards processor 114 and the heat sink 116 associated with processor 114. Additionally, exits 126, 128, and 130 may direct a portion of the mist provided by these exits towards processors 110 and 114 and the heat sinks 112 and 116 associated with processors 110 and 114. Additionally, exits 126, 128, and 130 may direct mist towards circuits 118 and 122 and associated cards/risers 120 and 124.

In some embodiments, mist exits, such as mist exits 134 and 136 may be designed to concentrate a mist flow on a high-heat producing component, such as processor 110 and associated heat sink 112 and such as processor 114 and associated heat sink 116. In some embodiments, heat sinks 112 and 116 may conduct waste heat away from processors 110 and 114 and mist sprayed on heat sinks 112 and 116 via mist exits 134 and 136 may coat the heat sinks with liquid droplets of dielectric fluid that change phase to remove heat from heat sinks 112 and 116.

In some embodiments, other mist exits, such as mist exit 138, may be configured to generally fill a volume or portion of a volume of chassis 102 with mist droplets suspended in air. The mist droplets may then land on/come in contact with various heat producing components mounted in chassis 102 and may change phase to remove waste heat from the heat producing components. For example, mist directed from mist exit 138 may fill a space comprising storage devices 144, 146, and 148 such that mist droplets land on the storage devices 144, 146, and 148 and provide cooling to the storage devices 144, 146, and 148. Additionally, mist from mist exit 138 and/or surplus mist from mist exits 126, 128, 130, 134, and 136 may generally fill the interior of chassis 102 with mist, such that liquid droplets of dielectric fluid land on circuit 140 and card 142 to remove waste heat from the circuit and card.

Note that FIG. 1 illustrates an example configuration of mist exits. However, in some embodiments various other mist exit configurations may be used. In some embodiments, other mist configurations may be used wherein some mist exits concentrate a mist flow on high-heat producing components while other mist exits provide a mist flow that generally fills a volume or space of the chassis adjacent to the mist exit, wherein the volume or space filled with mist includes various lower heat producing components that are cooled by the mist.

Figure 8:
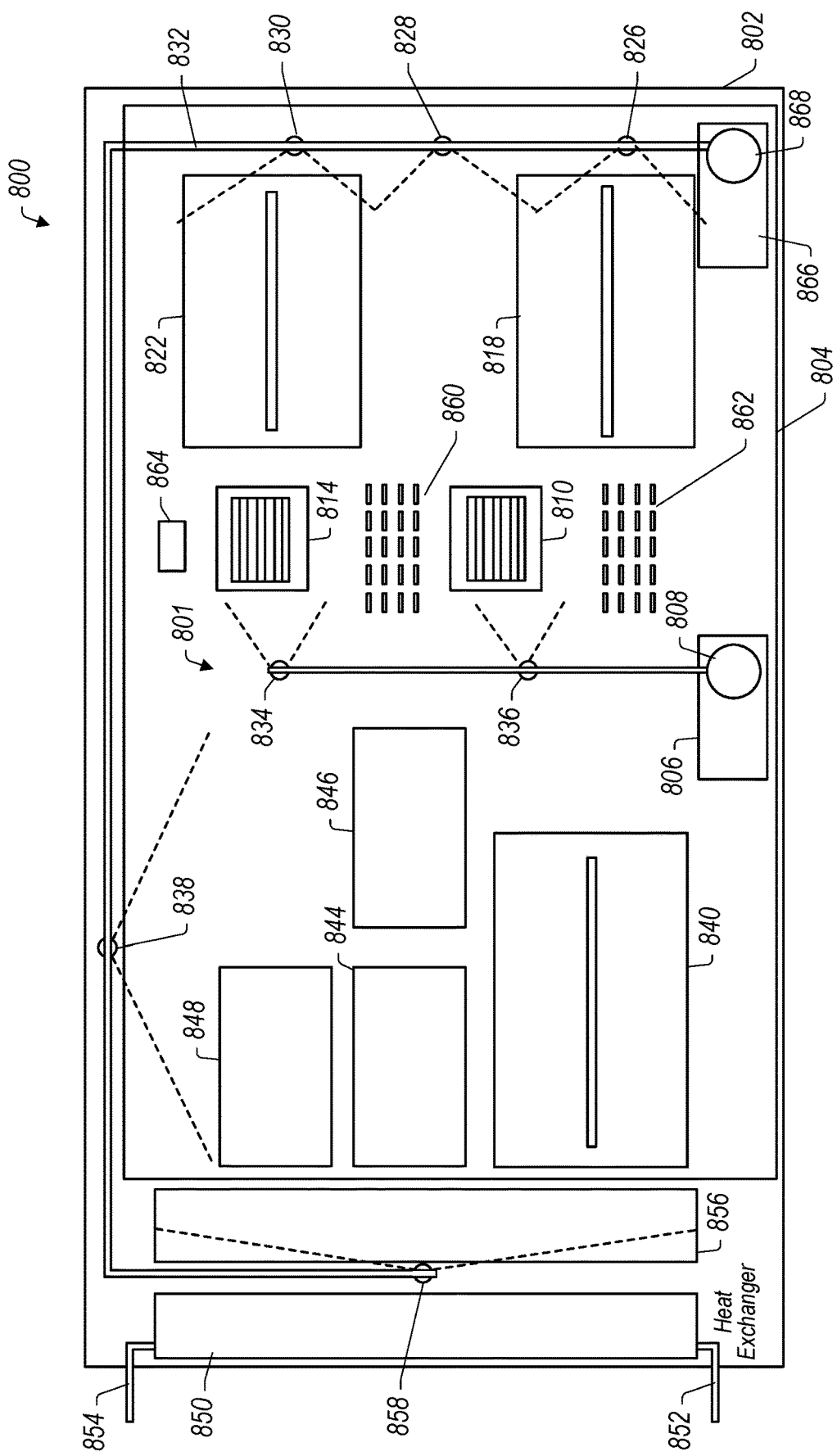
FIG. 8 is a top view of a computer system that includes a mist cooling system that utilizes multiple mist generators and cooling circuits, according to some embodiments.

In some embodiments, multiple mist generators may be used, such as described in FIG. 8, wherein a first mist generator generates a mist with larger diameter liquid droplets, wherein the mist with larger diameter liquid droplets are to be provided to a mist exit that concentrates mist flow on a high-heat producing component. In such embodiments, a second mist generator may generate a mist comprising smaller diameter liquid droplets that are provided to a mist exit that generally fills a volume or space of a chassis with mist. The mist with smaller diameter liquid droplets may retain the liquid droplets in suspension for a longer period of time than would be the case for the larger diameter liquid droplets. Thus, in some embodiments, the smaller diameter liquid droplets may better fill the chassis 102 with mist.

In some embodiments, a mist cooling system and/or computer system, such as mist cooling system 101 of computer system 100, may include a heat exchanger, such as heat exchanger 150. In some embodiments, a liquid or gaseous coolant, such as water or refrigerant, may pass through the heat exchanger, for example via inlet 152 and outlet 154. The coolant flow through heat exchanger 150 may cause condensation of dielectric fluid in the vapor phase that has been vaporized due to removing waste heat from heat producing components of computer system 100. The vaporized dielectric fluid may be converted back to a liquid phase via condensation on heat exchanger 150. The liquid dielectric fluid may then drain back to reservoir 106 to be recycled. For example, mist generator 108 may then draw the dielectric fluid from reservoir 106 to generate additional mist to supply to mist exits 126, 128, 130, 134, 136, and 138 via tubes 132.

FIG. 2A is a top view of a computer system that includes a mist cooling system, according to some embodiments.

In some embodiments, computer system 200 illustrated in FIG. 2 may be a same or similar computer system as computer system 100 illustrated in FIG. 1.

Computer system 200 includes chassis 202 and circuit board 204 mounted within chassis 202. Also, mist cooling system 101 is mounted within chassis 202. Processors 210 and 214 are mounted on circuit board 204. Additionally, baseboard management controller (BMC) 264 is mounted on circuit board 204. Also, circuit 240 and storage devices 244, 246, and 248 are coupled to circuit board 204.

Computer system 200 also includes power distribution board 256 mounted in chassis 202 and heat exchanger 250 mounted in chassis 202.

Mist cooling system 201 includes reservoir 206 and mist generator 208 along with tubes 232 and mist exits 226, 228, 230, 234, 236, 238, and 258. Mist exit 236 directs a concentrated flow of mist towards heat sink 212 and processor 210. Also, mist exit 234 directs a concentrated flow of mist towards heat sink 216 and processor 214. Mist exits 226, 228, and 230 direct mist towards circuits 218 and 222 and associated cards/risers 220 and 224. Additionally, mist exits 226, 228, and 230 may supplement mist flow from mist exits 234 and 236, such that additional mist is provided to wet heat sinks 212 and 216 and associated processors 210 and 214. In some embodiments, drain ports 260 and 262 may enable liquid droplets of the mist that have coalesced into a liquid and fallen out of suspension in the air to drain back to reservoir 206. Mist cooling system 101 also includes mist exit 238 which generally fills the volume of chassis 202 with mist that wets storage devices 244, 246, and 248 and circuit 240 and associated riser 242. Mist exit 258 supplies mist to cool power distribution board 256.

Computer system 200 also includes heat exchanger 250 in chassis 202. Heat exchanger 250 is configured to condense dielectric fluid vapor in chassis 202 such that the vaporized dielectric fluid condenses back into a liquid state and drains back to reservoir 206. In some embodiments, a cooling fluid may be circulated through heat exchanger 250 via inlet 252 and outlet 254.

Figure 2B:
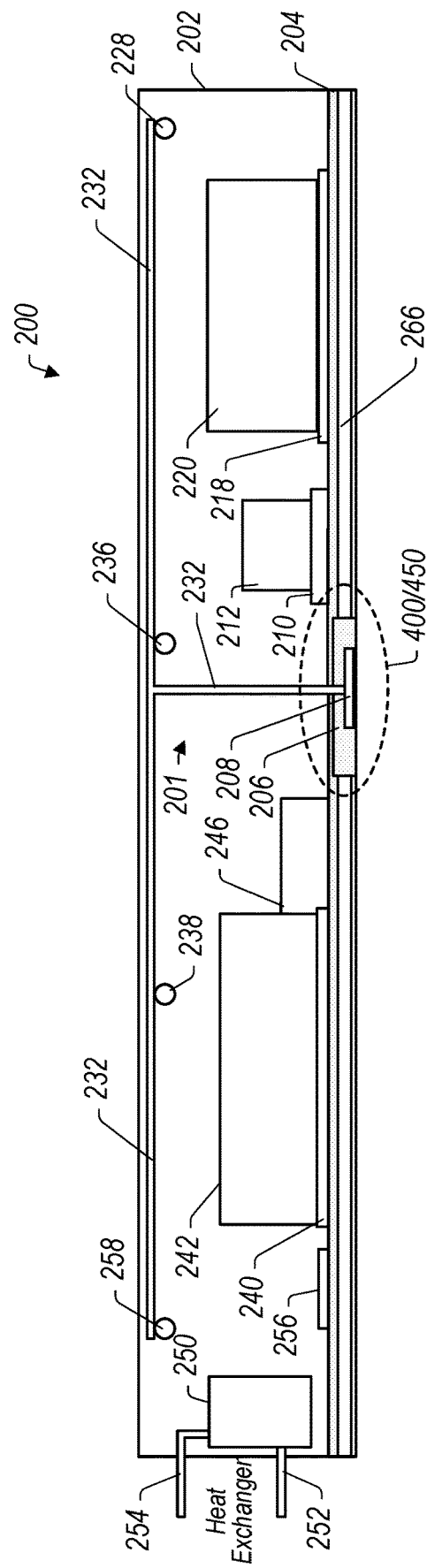
FIG. 2B is a side view of a computer system that includes a mist cooling system, according to some embodiments.

FIG. 2B is a side view of a computer system that includes a mist cooling system, according to some embodiments.

As can be seen in FIG. 2B, in some embodiments, mist exits, such as mist exits 228, 236, and 258 may be positioned above or adjacent to a component to be cooled by mist directed from the mist exits. Also as shown in FIG. 2B, in some embodiments a spacer element 266 may support circuit board 204 above a bottom surface of chassis 202 to form reservoir 206. Also, as discussed in more detail in regards to FIGS. 4A and 4B, which illustrate more detailed views a computer system 400 and 450 with a reservoir 206, the spacer element 266 may be configured with a slope such that dielectric fluid that has condensed in the chassis 202 flows back to reservoir 206.

Figure 2C:
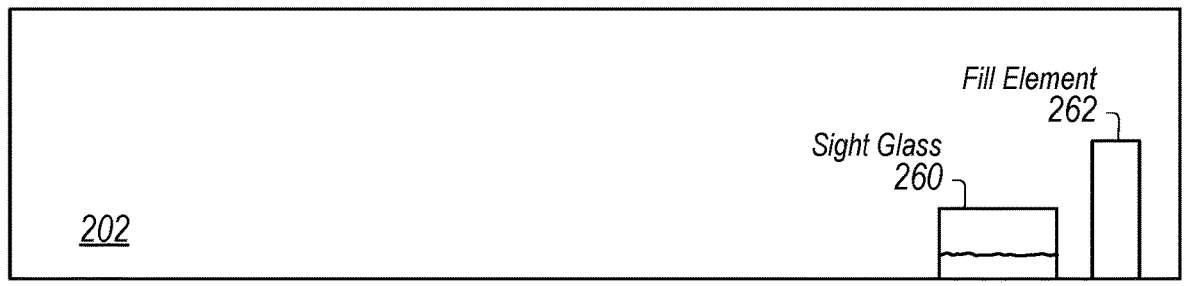
FIG. 2C is a front view of a computer system that includes a mist cooling system that illustrates a sight glass and fill element for the mist cooling system, according to some embodiments.
Figure 2D:
FIG. 2D is a side view illustrating the fill element in an open position, according to some embodiments.
Figure 2E:
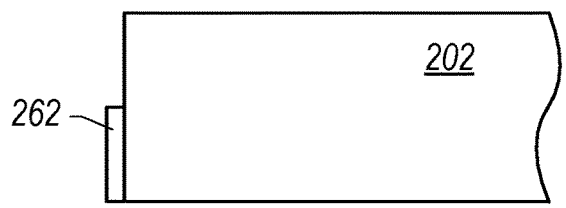
FIG. 2E is a side view illustrating the fill element in a closed position, according to some embodiments.

FIG. 2C is a front view of a computer system that includes a mist cooling system that illustrates a sight glass and fill element for the mist cooling system, according to some embodiments. FIG. 2D is a side view illustrating the fill element in an open position, according to some embodiments. FIG. 2E is a side view illustrating the fill element in a closed position, according to some embodiments.

In some embodiments, a computer system comprising a mist cooling system, may include a sight glass that enables observation of a level of dielectric fluid in reservoir 206 from a vantage point external to the chassis. Also, in some embodiments, a computer system comprising a mist cooling system, may include a fill element that can be opened to allow additional dielectric fluid to be added to reservoir 106 without requiring the chassis 202 to be opened.

For example, FIG. 2C illustrates sight glass 260 and fill element 262 when viewed from a front view. FIG. 2D illustrates a side view wherein fill element 262 has been opened to allow additional dielectric fluid to be added to chassis 202 and FIG. 2E shows the fill element 262 in a closed state, for example after adding dielectric fluid to chassis 202.

FIG. 3A is a block-diagram illustrating operation of a single-stage mist generator, according to some embodiments.

As discussed above, in some embodiments various types of mist generators may be used, such as single phase or two-phase ultrasound atomizers.

Atomizer 300 includes a single piezoelectric driver 302. Dielectric fluid 308 enters into atomizer 300 and forms a sheet of dielectric liquid on piezoelectric driver 302. Vibrations of piezoelectric driver 302 cause droplets of the dielectric fluid to escape the surface of the sheet of dielectric liquid and form droplets of a generated mist. For example, the energy imparted to the fluid of the sheet of dielectric liquid may cause the droplets to overcome the forces of surface tension of the liquid sheet and escape as droplets suspended in air. Furthermore, nozzle 306 may direct the generated mist out of the atomizer 300 and may be a converging nozzle that increases a velocity of the mist and causes additional air 310 to be entrained in the mist flow out of nozzle 306 and into tube 332. This may further help to provide a motive force to convey the mist through attached tubes.

In some embodiments, a liquid level 304 of dielectric fluid 308 may be maintained such that the dielectric fluid forms a liquid sheet over the piezoelectric driver 302 without fully filing the cavity of the atomizer 300 above piezoelectric driver 302.

FIGS. 3B and 3C are block-diagrams illustrating operation of a two-stage mist generator with different reservoir levels, according to some embodiments.

In some embodiments, a two-phase atomizer 350 may be used. A two-stage atomizer may be more tolerant of fluctuations in the liquid level 304 than is the case for a single phase atomizer, such as atomizer 300.

A two-stage atomizer, such as atomizer 350, may include a first stage diver 352 that draws dielectric fluid 308 into the atomizer 350 to form a sheet of liquid over stage 2 driver 354. Stage 2 driver 354 may then oscillate to impart ultrasound energy into the thin sheet of liquid causing droplets of the liquid to escape the surface of the thin sheet of liquid and form droplets of a generated mist. In a similar manner as the one stage atomizer 300, the two-stage atomizer 350 may include a converging nozzle 356 that increases the velocity of the generated mist and also entrains air 310 with the mist as the mist flows into tube 332.

In contrast to the single stage atomizer 300, the two-state atomizer 350 may tolerate fluctuating liquid levels 304 as shown in FIGS. 3B and 3C.

FIGS. 4A and 4B illustrate side views of a reservoir, wherein different types of mist generators are either positioned in the dielectric fluid of the reservoir or positioned at a surface of the dielectric fluid of the reservoir, according to some embodiments.

In some embodiments, a spacer such as spacer 402 may be positioned in a bottom portion of a chassis, such as chassis 202, to form a reservoir 404. The spacer 402 may be sloped such that condensed or coalesced dielectric fluid flows back to the reservoir 404. In some embodiments, a computer system 400 may include a two-stage atomizer, such as atomizer 350, positioned at least partially below the surface of the liquid in reservoir 404. In other embodiments, a computer system 450 may include a single stage atomizer, such as atomizer 300, positioned in-line with the surface of the liquid in reservoir 404.

Figure 5:
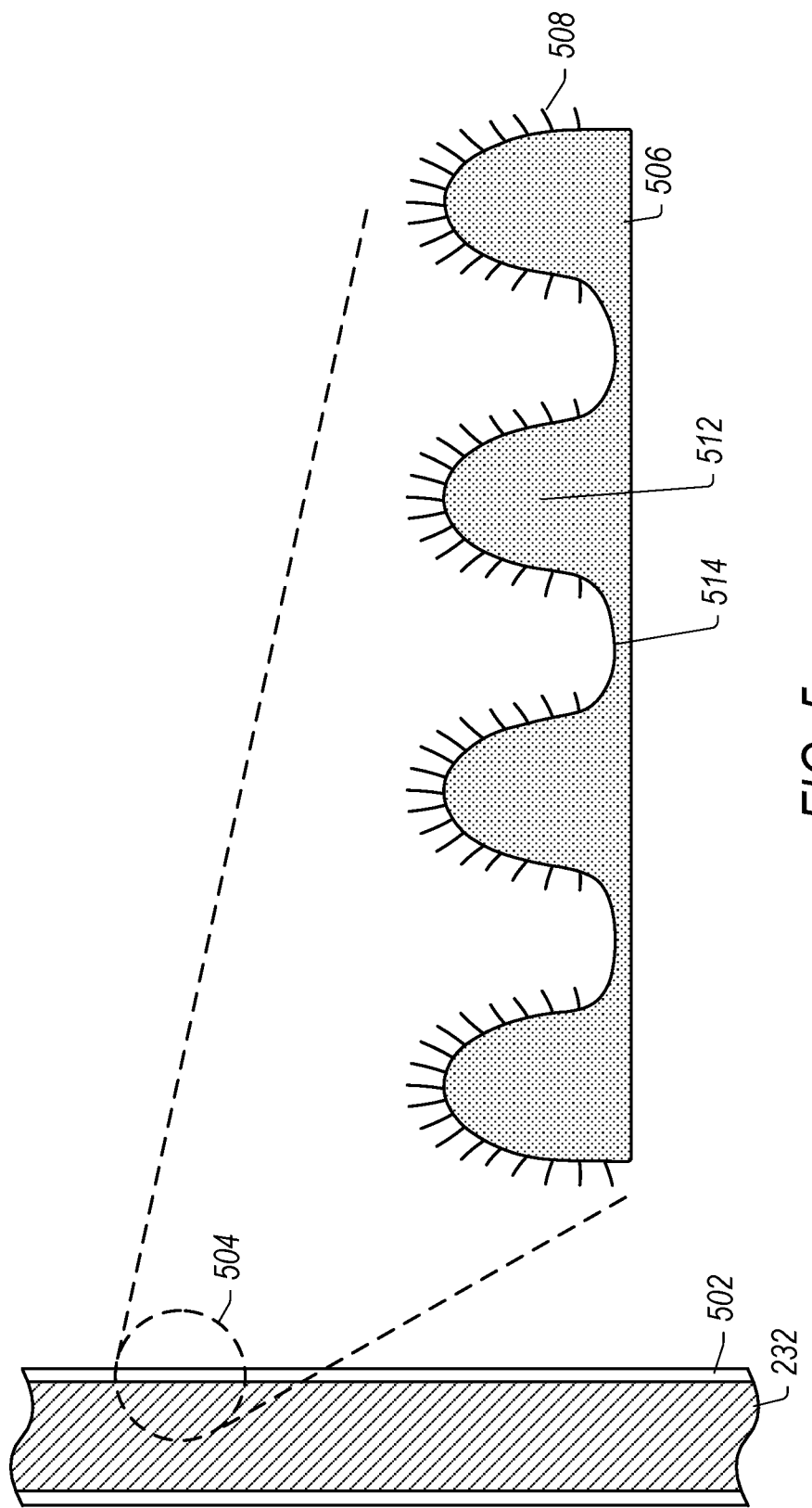
FIG. 5 illustrates a wall structure of tubes used in a mist cooling system, according to some embodiments.

FIG. 5 illustrates a wall structure of tubes used in a mist cooling system, according to some embodiments.

Tube 232 includes tube wall 502 and detail area 504 shows a simplified view of a structure of an inner portion of tube wall 502.

A microstructure 506 of the inner tube wall 504 includes peaks 512 and valleys 514 that are separated by a distance less than an average droplet diameter size. For example, in some embodiments the peaks and valleys may be separated by a distance of approximately 3 to 5 microns, and the droplets may have diameters that range from 20 microns (for small droplets) to 40 microns (for larger droplets). Thus, a droplet being conveyed via tube 232 does not get stuck in a valley of the microstructure, but instead continues to flow through the tube 232. Additionally, in some embodiments, nanoparticles 508 cover the peaks and valleys of the microstructure and a nylon coating is further placed over the nanoparticles 508. The nylon surface coating may have a low surface energy that does not draw droplets to the surface and that does not cause droplets to adhere to the surface. In some embodiments, such a configuration may be described as non-wettable tubes.

Figure 6:
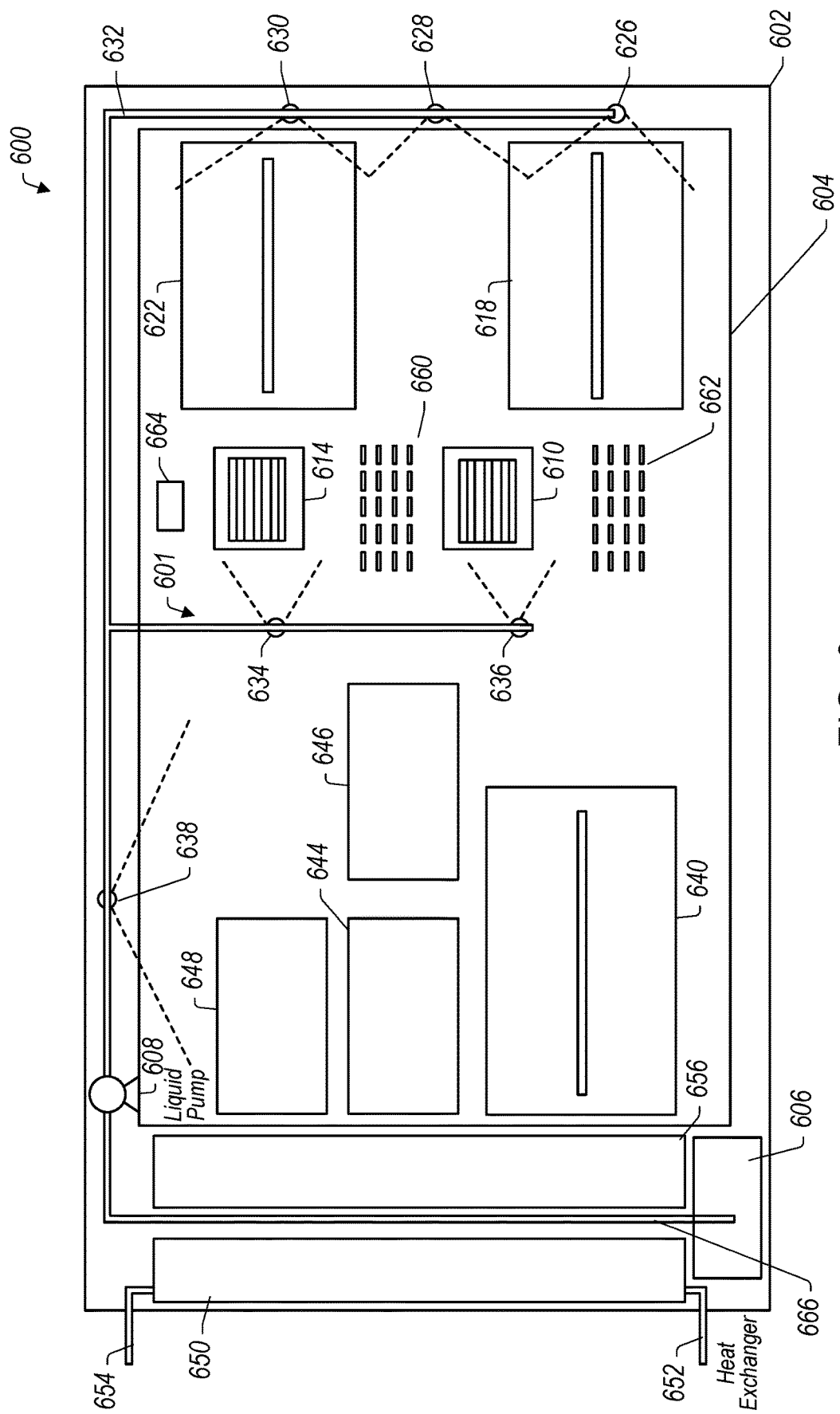
FIG. 6 is a top view of a computer system that includes a mist cooling system that utilizes a liquid pump, according to some embodiments.

FIG. 6 is a top view of a computer system that includes a mist cooling system that utilizes a liquid pump, according to some embodiments.

In some embodiments, other types of mist generators may be used instead of, or in addition to, an ultrasound atomizer. For example, in FIG. 6 mist cooling system 601 included in computer system 600 includes a liquid pump 608 and atomizing nozzles 626, 628, 630, 634, 636, and 638.

In some embodiments, computer system 600 includes processors 610 and 614 that are cooled by mist from atomizing nozzles 636 and 634. Also circuits 618 and 622 are cooled by mist from atomizing nozzles 626, 628, and 630. Additionally, mist generated by atomizing nozzles 626, 628, and 630 may cool circuits 610 and 614. Coalesced dielectric fluid may drain back to reservoir 606 via drain ports 660 and 662. Also atomizing nozzle 638 may provide a mist that cools storage drives 644, 646, and 648. Additionally, mist generated by any of the nozzles in chassis 602 may fill the chassis with mist that cools circuit 640 and power distribution board 656. Suction tube 666 may allow liquid pump 608 to draw dielectric fluid form reservoir 606.

Computer system 600 also includes heat exchanger 650 that flows cooling fluid via inlet 652 and outlet 654 to condense vaporized dielectric fluid, such that the condensed dielectric fluid returns to reservoir 606.

In some embodiments BMC 664 may provide active control for liquid pump 608 to control a pressure and corresponding flow rate of dielectric fluid through mist cooling system 601.

Figure 7:
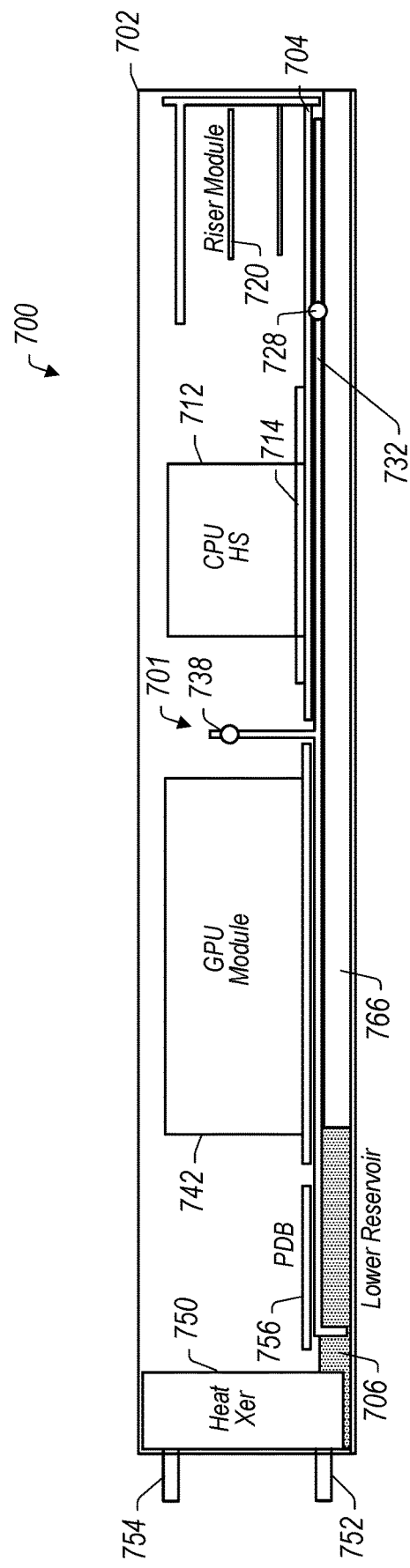
FIG. 7 is a side view of a computer system that includes a mist cooling system that utilizes a lifting spacer to form a reservoir for cooling fluid, according to some embodiments.

FIG. 7 is a side view of a computer system that includes a mist cooling system that utilizes a lifting spacer to form a reservoir for cooling fluid, according to some embodiments.

Computer system 700 includes mist cooling system 701 and heat producing components, such as central processing unit (CPU) 714, graphic processing module (GPU module) 742, riser module 720 and power distribution board 756. Note that in some embodiments other configurations of heat producing components may be included in computer system 700.

The heat producing components are mounted on printed circuit board 704 and tube 732 runs in a space between printed circuit board 704 and a bottom surface of chassis 702, wherein the space is formed by spacer 766. A pump (not shown), such as pump 608, draws dielectric fluid from reservoir 706 and pressurizes the dielectric fluid in tubes 732. Atomizing nozzles 728 and 732 direct a mist at the heat producing components to cool the heat producing components.

Heat exchanger 750 is cooled via coolant flow from inlet 752 flowing to outlet 754 and causes vaporized dielectric fluid to condense and drain down into reservoir 706 where it can be drawn back into tubes 732 via a pump, such as pump 606.

FIG. 8 is a top view of a computer system that includes a mist cooling system that utilizes multiple mist generators and cooling circuits, according to some embodiments.

In some embodiments, a computer system may include multiple mist generators that are separately controlled and that may provide mists at different flow rates and having different droplet diameters. For example, computer system 800 includes mist cooling system 801, which includes a first mist generator 808 and a second mist generator 868. In some embodiments, the two mist generators may share a common reservoir or may be positioned in separate reservoirs, such as reservoir 806 and reservoir 866. In some embodiments, BMC 864 may control both mist generator 808 and mist generator 868.

In some embodiments, a first mist generator, such as mist generator 808 may provide a mist to cool high-heat producing components such as processors 810 and 814, via mist exits 834 and 836. In some embodiments, the first mist generator may generate a mist with larger diameter liquid droplets than the second mist generator. Also, the mist flow rates from the two mist generators may be separately controlled by BMC 864.

In some embodiments, mist generator 868 may generate a second mist with smaller diameter liquid droplets than the mist generated by mist generator 808. The smaller diameter droplet mist may be conveyed via tubes 832 to mist exits 826, 828, 830, 838, and 858. The smaller diameter mist may generally fill an interior of chassis 802 and provide cooling to circuit 818, 822, and 840 and storage devices 844, 846, and 848. Additionally the mist exit 858 may provide cooling to power distribution board 856.

Heat exchanger 850 may circulate cooling fluid via inlet 852 and outlet 854 to condense vaporized dielectric fluid such that the condensed liquid dielectric fluid flows back to reservoirs 806 and 866.

Figure 9A:
Figure 9B:

FIGS. 9A, 9B, and 9C illustrate simplified versions of example design tables for a mist cooling system, according to some embodiments.

In some embodiments, one or more design tables for a mist generator may be provided to a baseboard management controller for use in controlling the mist generator. For example table 900 includes signal frequencies and corresponding droplet sizes that may be used to control a mist generator to generate a mist having the droplet sizes indicated in the table.

Table 950 includes input voltages that may be supplied to a mist generator and corresponding mist flowrates for a mist generated when the indicated voltages are supplied. A baseboard management controller (BMC) of a computer system may adjust signal voltages and frequencies according to design tables 900 and 950 to control mist flowrate and droplet size, according to some embodiments. In some embodiments, a BMC may not adjust voltage to control the mist generator but may instead use signal frequency to control the mist generator. In other embodiments, a BMC may adjust voltage and/or frequency to control a mist generator.

In some embodiments, a baseboard management controller may control a mass flowrate in addition to or instead of controlling a droplet size. For example, by increasing a droplet size, a mass flowrate may be increased because larger droplets will include more mass per volume. Also, a mass flowrate may be increased by increasing a volumetric flowrate, assuming a same droplet size. For example, table 970 includes input signal frequencies and corresponding mass flowrates that will be provided by a given mist generator having a design corresponding to design table 970. A baseboard management controller may adjust signal frequencies according to design table 970 to control a mass flowrate of mist provided to heat producing components.

In some embodiments, design tables 900, 950, and 970 may be stored in a memory available to a BMC or otherwise provided to the BMC for use in determining control signals to control a mist generator and therefore control cooling in a computer system.

FIG. 10 illustrates a simplified version of a control table for a mist cooling system, according to some embodiments.

In some embodiments, additionally, or alternatively to the design tables 900, 950, and 970 illustrated in FIG. 9, a BMC may be provided with a design table 1000 indicating rates of waste heat removal corresponding to different control outputs. In some embodiments, a transducer or other component of a mist generator may convert the control output signals as shown in FIG. 10 into corresponding voltages and frequencies to be used to control a mist generator.

Figure 11:
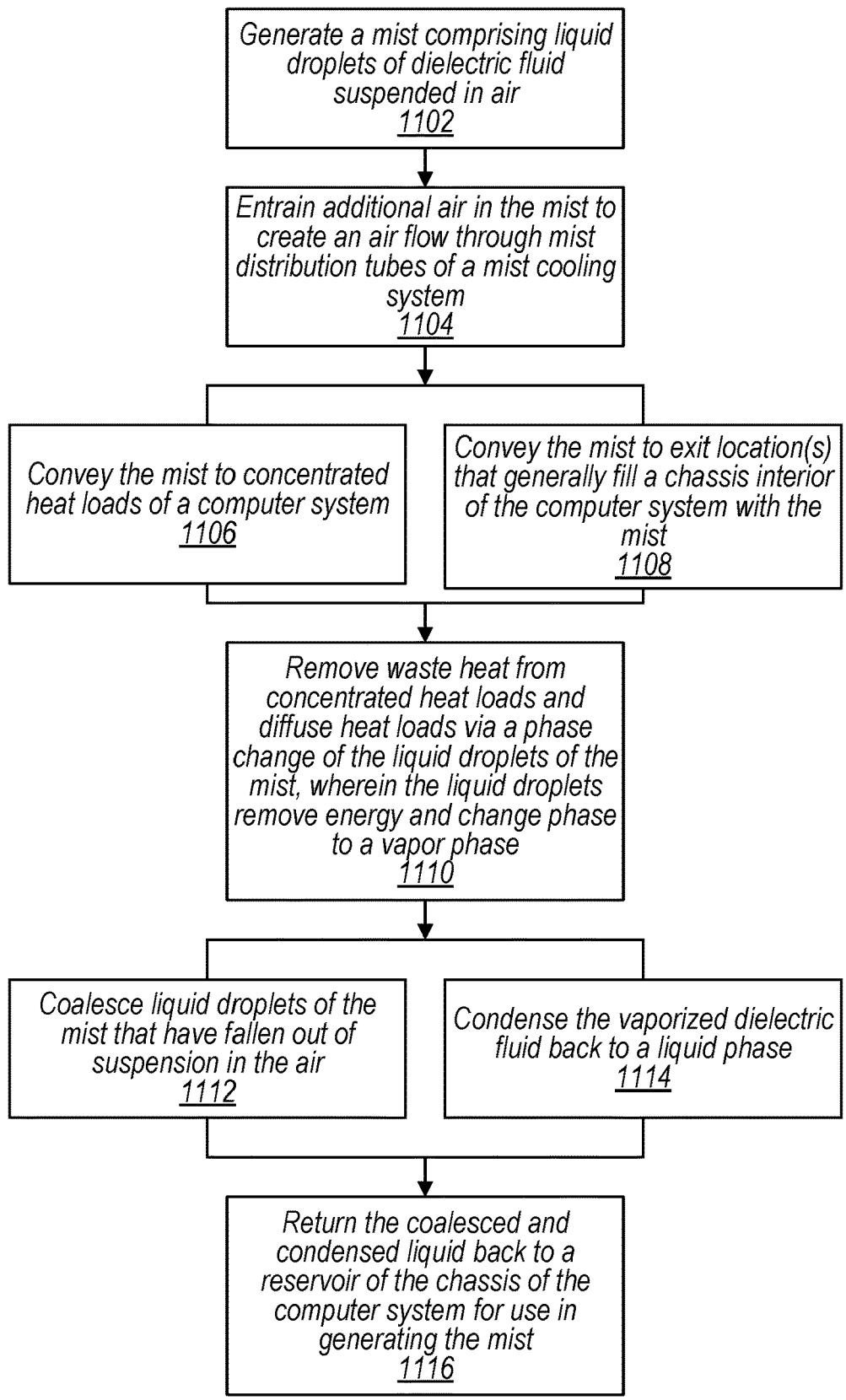
FIG. 11 illustrates a method of cooling components in a computer system using a mist cooling system, according to some embodiments.

FIG. 11 illustrates a method of cooling components in a computer system using a mist cooling system, according to some embodiments.

At 1102, a mist cooling system of a computer system generates a mist comprising liquid droplets of dielectric fluid suspended in air.

At 1104 additional air is entrained in the mist to create an airflow though mist distribution tubes of the mist cooling system. For example, a converging nozzle of a mist generator may entrain air in the mist as the mist exits the mist generator and flows into the mist distribution tubes.

At 1106, the mist is conveyed to concentrated heat loads of the computer system. Additionally, or alternatively, at 1108 the mist is conveyed to mist exit locations that generally fill a chassis of the computer system with the mist.

At 1110, waste heat is removed from heat producing components of the computer system due to liquid droplets of the mist that have wetted the heat producing components undergoing a phase change from a liquid phase to a vapor phase. Latent heat of vaporization may cause waste heat to be extracted from the heat producing components when the liquid dielectric fluid drops undergo the phase change to the vapor phase.

At 1112, droplets that have not changed phases may coalesce with other droplets and form droplets that fall out of suspension in the air. The droplets may then flow, due to gravity, back to a reservoir of the mist cooling system.

At 1114, vaporized dielectric fluid may be condensed at a heat exchanger back into a liquid phase and may flow, due to gravity, back to a reservoir of the mist cooling system.

At 1116, the dielectric fluid returns back to the reservoir and may be re-used at 1102 to generate mist.

Figure 12:
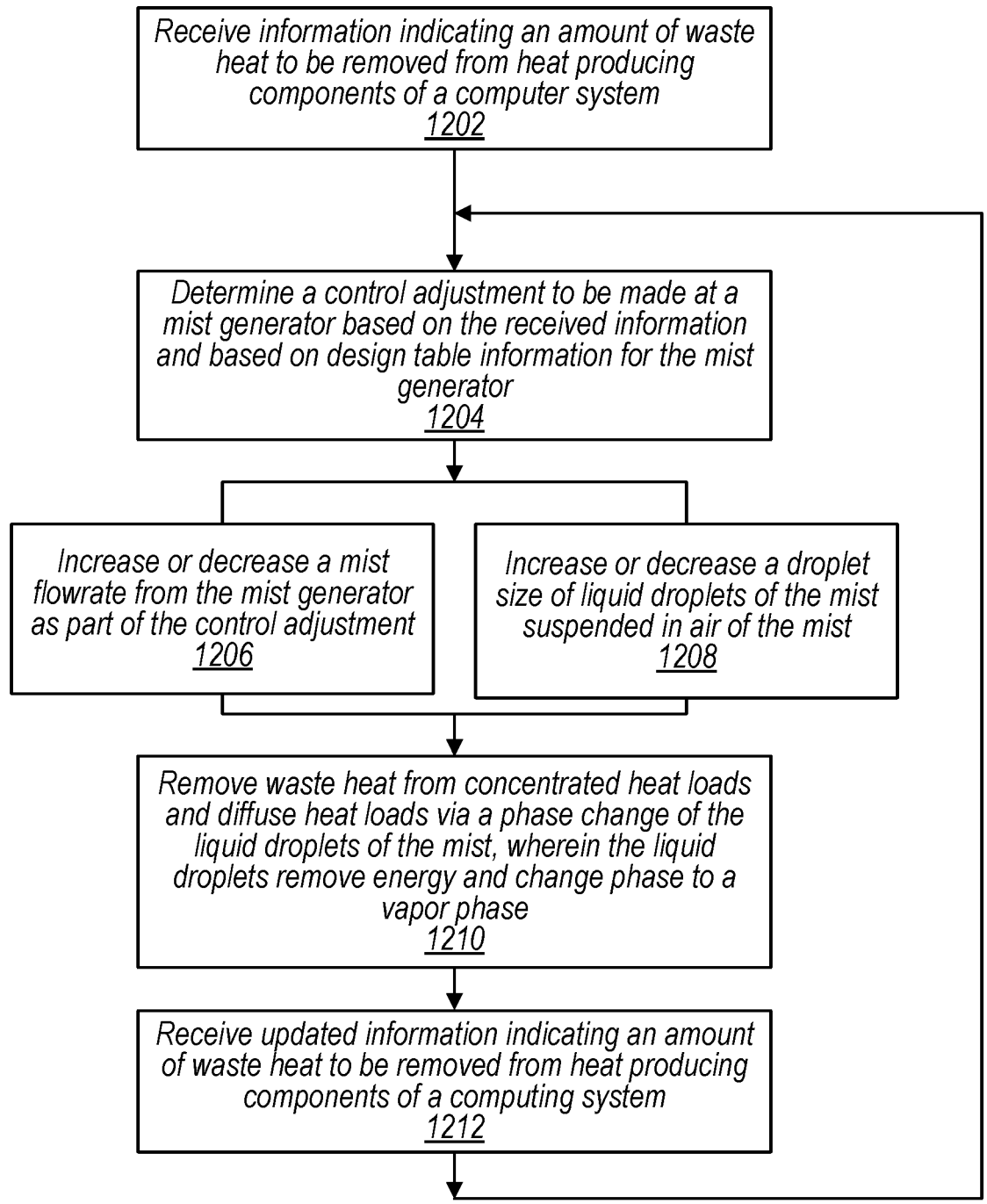
FIG. 12 illustrates an example method of controlling a mist cooling system, according to some embodiments.

FIG. 12 illustrates an example method of controlling a mist cooling system, according to some embodiments.

At 1202, a controller for a mist cooling system, such as a baseboard management controller (BMC), receives information indicating an amount of waste heat to be removed from heat producing components of a computer system. For example, temperature measurements, processor utilization measurements, power consumption measurements, etc. may be used by a controller to determine an amount of waste heat to be removed from various heat producing components of a computer system.

At 1204, the controller determines a control adjustment to be made at a mist generator based on the information received at 1202 and based on one or more design tables for the mist generator.

At 1206, the controller increases or decreases a mist flowrate from the mist generator as part of the control adjustment. For example, the controller may increase or decrease a voltage supplied to the mist generator to adjust the amplitude of oscillations of a piezoelectric drive and therefore adjust the flowrate of mist, for example using a design table as shown in FIG. 9B. Also, in other embodiments, the controller may increase or decrease a signal frequency supplied to the mist generator to adjust a frequency of oscillations of a piezoelectric drive and therefore adjust the mass flowrate of the mist, for example using a design table as shown in FIG. 9C Additionally, or alternatively, at 1208, the controller may increase or decrease the droplet size of liquid droplets of dielectric fluid suspended in air in the mist. For example, a controller may adjust a frequency of the power provided to the mist generator to alter an oscillation frequency of a vibrating element of the mist generator, which in turn may adjust the droplet diameter of droplets included in the mist, for example using a design table as shown in FIG. 9A.

In some embodiments, the control decisions at 1206 and 1208 may be combined into a single control output, for example using a design table as shown in FIG. 10. In some embodiments, a controller, such as a BMC, may output a control signal as a percent output of a possible control range and a local control element of a mist generator, such as a Piezoelectric drive or pump may determine respective control adjustments, such as signal frequency and/or voltage, that are required to achieve the selected control output.

At 1210, the mist is supplied to the heat producing components to remove heat from the heat producing components.

At 1210, the controller receives updated information indicating an amount of waste heat to be removed from heat producing components of a computing system. Then at 1204, the controller uses the updated information to determine a control adjustment for a subsequent control iteration.

The various methods as illustrated in the figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A computer system, comprising:
   a chassis;
   a plurality of heat producing components mounted in the chassis; and
   a mist cooling system configured to remove waste heat from the plurality of heat producing components mounted in the chassis,
   wherein the mist cooling system comprises:
      a reservoir positioned in a bottom portion of the chassis;
      a mist generator configured to:
         generate a mist comprising liquid droplets of a dielectric fluid suspended in air;
      one or more tubes coupled with the mist generator, wherein the one or more tubes are configured to direct the mist to one or more of the plurality of heat producing components of the computer system, and wherein the one or more tubes comprise a microstructure on an inner surface of the one or more tubes comprising peaks and valleys configured to prevent the liquid droplets of the mist from coalescing in the one or more tubes; and
      a heat exchanger mounted in the chassis configured to condense a portion of the dielectric fluid that has changed phase from a liquid phase to a vapor phase, wherein the portion of the dielectric fluid in the vapor phase has undergone a phase change as part of removing the waste heat from the plurality of heat producing components of the computer system.

2. The computer system of claim 1, wherein the mist generator of the mist cooling system is further configured to:
    entrain additional air with the generated mist to create an air flow that causes the mist to flow through the one or more tubes to the plurality of heat producing components of the chassis.

3. The computer system of claim 1, wherein
    the valleys have a width less than an average droplet diameter of the liquid droplets of the mist.

4. The computer system of claim 3, wherein the one or more tubes further comprise:
    nanoparticles extending out from the microstructure; and
    a nylon coating applied over the microstructure and nanoparticles.

5. The computer system of claim 1, wherein:
    one or more exits from respective ones of the one or more tubes are directed at high-heat producing components of the plurality of heat producing components mounted in the chassis; and
    lower heat producing components of the plurality of heat producing components mounted in the chassis are cooled by liquid droplets of the mist that remain suspended in the air in an interior space of the chassis subsequent to exiting the respective one or more exits of the one or more tubes directed at the high-heat producing components.

6. The computer system of claim 5, wherein the high-heat producing components comprise a central processor or graphics processor of the computer system.

7. A system comprising:
    a reservoir configured to be positioned in a bottom portion of a chassis of a computer system; and
    a mist generator configured to:
        generate a mist comprising liquid droplets of a dielectric fluid suspended in air; and
    one or more tubes coupled with the mist generator, wherein the one or more tubes are configured to direct the mist to one or more heat producing components of the computer system, and wherein the one or more tubes comprise a microstructure on an inner surface of the one or more tubes comprising peaks and valleys configured to prevent the liquid droplets of the mist from coalescing in the one or more tubes.

8. The system of claim 7, further comprising:
    a heat exchanger configured to mount in the chassis, wherein the heat exchanger is configured to condense a portion of the dielectric fluid that has changed phase from a liquid phase to a vapor phase.

9. The system of claim 7 wherein the mist generator comprises:
    a first stage configured to draw the dielectric fluid from the reservoir and towards an oscillating element of the mist generator; and
    a second stage configured to generate the mist by applying ultrasound vibrations from the oscillating element to the dielectric fluid drawn into the mist generator.

10. The system of claim 7 wherein the mist generator comprises:
    a single stage configured to allow dielectric fluid to flow into the mist generator and generate the mist by applying ultrasound vibrations from an oscillating element to the dielectric fluid.

11. The system of claim 7, further comprising a controller configured to:
    receive information indicating an amount of waste heat to be removed from the one or more heat producing components of the computer system; and
    adjust an output of the mist generator based on the received information.

12. The system of claim 11, wherein adjusting the output comprises:
    increasing or decreasing a mass flow rate of mist generated by the mist generator; or
    increasing or decreasing a droplet size of the dielectric fluid droplets of the mist suspended in the air of the mist.

13. The system of claim 11, wherein the controller is implemented via a baseboard management controller (BMC) of the computer system.

14. The system of claim 11, further comprising a memory storing a design table for the mist generator, wherein the design table indicates electrical frequencies or voltages to be provided to the mist generator to achieve respective mist flow rates or respective droplet sizes.

15. The system of claim 11, further comprising a memory storing a design table for the mist generator, wherein the design table indicates electrical frequencies or voltages to be provided to the mist generator and corresponding waste heat removal rates.

16. The system of claim 7, further comprising:
    an additional mist generator, wherein the mist generator and the additional mist generator are configured to generate respective mists with different respective suspended droplet sizes of dielectric fluid suspended in the respective mists.

17. The system of claim 16, wherein:
    a first one of the respective mists with larger suspended droplets or a greater mass flow is directed to high-heat producing components of the one or more heat producing components of the computer system; and
    a second one of the respective mists with smaller suspended droplets or a smaller mass flow is generally directed to the chassis interior, such that the second mist cools lower-heat producing components of the one or more heat producing components of the computer system that are not targeted by one or more tube exits providing the first mist.

18. The system of claim 7, wherein the chassis further comprises:
    a sight glass configured to indicate a level of the dielectric fluid in the reservoir when viewed from outside the chassis; and
    an exterior fill receptacle configured to enable dielectric fluid to be added to the reservoir without opening the chassis.

19. A method, comprising:
    generating, using dielectric fluid from a reservoir in a chassis of a computing system, a mist comprising droplets of the dielectric fluid suspended in air;
    conveying the mist, via one or more tubes mounted in the chassis of the computer system, to heat producing components of the computer system, and wherein the one or more tubes comprise a microstructure on an inner surface of the one or more tubes comprising peaks and valleys configured to prevent the droplets of the mist from coalescing in the one or more tubes; and
    removing waste heat from the heat producing components wherein liquid droplets of the mist remove waste heat from the heat producing components as part of a phase change from a liquid phase to a vapor phase.

20. The method of claim 19, further comprising:
coalescing the liquid droplets of the mist such that the liquid droplets fall out of suspension with the air and return to the reservoir in the chassis of the computer system; and
condensing the vapor resulting from the phase change back into a liquid phase such that the liquid is returned to the reservoir in the chassis of the computer system.

\* \* \* \* \*